(12) United States Patent
Muraki et al.

(10) Patent No.: US 7,626,376 B2
(45) Date of Patent: Dec. 1, 2009

(54) ELECTRIC CURRENT DETECTOR HAVING MAGNETIC DETECTOR

(75) Inventors: Hitoshi Muraki, Aichi (JP); Kenji Tanaka, Aichi (JP)

(73) Assignee: Tokai Rika Co., Ltd., Aichi (JP)

( * ) Notice: Subject to any disclaimer, the term of this patent is extended or adjusted under 35 U.S.C. 154(b) by 0 days.

(21) Appl. No.: 11/901,819

(22) Filed: Sep. 19, 2007

(65) Prior Publication Data

US 2008/0094060 A1    Apr. 24, 2008

(30) Foreign Application Priority Data

Sep. 20, 2006  (JP) .............................. 2006-254282
Feb. 21, 2007  (JP) .............................. 2007-040750

(51) Int. Cl.
G01R 33/07   (2006.01)
G01R 15/18   (2006.01)
G01R 19/20   (2006.01)
G01R 15/20   (2006.01)

(52) U.S. Cl. .............................. 324/117 R; 324/117 H (58) Field of Classification Search ............. 324/117 R, 324/117 H
See application file for complete search history.

(56) References Cited

U.S. PATENT DOCUMENTS 4,473,810 A * 9/1984 Souques et al. ............. 336/115
5,196,794 A * 3/1993 Murata ........................ 324/251
5,642,041 A * 6/1997 Berkcan ...................... 324/127
6,472,878 B1 * 10/2002 Bruchmann ................. 324/424
6,512,359 B1 * 1/2003 Tamai et al. ............ 324/117 R

FOREIGN PATENT DOCUMENTS

CN    2470832 Y    1/2002
JP    08-015330    1/1996

OTHER PUBLICATIONS

Ramsden et al., "Ten Easy Things to do with magnetic sensors", Mar. 1997, Sensors Magazine.*

* cited by examiner

Primary Examiner—Ha Tran T Nguyen
Assistant Examiner—Karen M Kusumakar
(74) Attorney, Agent, or Firm—Scully, Scott, Murphy & Presser, P.C.

(57) ABSTRACT

An electric current detector has a bus bar with a current direction changing section for changing a direction of electric current through the bus bar, and a magnetic detector disposed in the current direction changing section of the bus bar. The current direction changing section of the bus bar has a pair of parallel portions at which the bus bar is orthogonally deformed, and a connection portion at which the pair of parallel portions are connected, and the magnetic detector is disposed between the pair of parallel portions. The magnetic detector has a magnetic detection element disposed on a substrate, and a yoke surrounding the substrate and allowing the magnetic detection element to be placed between both ends thereof.

8 Claims, 9 Drawing Sheets

ELECTRIC CURRENT DETECTOR HAVING MAGNETIC DETECTOR

The present application is based on Japanese patent application Nos. 2006-254282 and 2007-040750, the entire contents of which are incorporated herein by reference.

BACKGROUND OF THE INVENTION

1. Field of the Invention

The present invention relates to an electric current detector for detecting the magnitude of the electric current flowing through an electric conductor from the magnetic field thereof.

2. Description of the Related Art

Heretofore, an electric current detector which can measure the electric current flowing through an electric conductor such as an electric wire and a bus bar has been used without inserting an ammeter or a resistor for detecting electric current as voltage on the way to the electric conductor such as the electric wire and the bus bar.

For example, such an electric current detector wherein a ferromagnetic core having gaps so as to surround a bus bar is allowed to intervene, and magnetosensitive elements are disposed in the gaps as described in JP-A-8-15330 has been known.

However, a conventional electric current detector grows in size, because cores occupying a space are necessary. Furthermore, when a plurality of bus bars is disposed adjacently, the magnetic field due to the adjacent bus bars is applied to a magnetosensitive element, so that a cause for decrease in detection accuracy arises.

Accordingly, an object of the present invention is to provide an electric current detector by which space-saving can be achieved, and highly precise current detection becomes possible.

SUMMARY OF THE INVENTION

According to one embodiment of the present invention, an electric current detector comprises:

a bus bar comprising a current direction changing section for changing a flow direction of electric current through the bus bar; and a magnetic detector disposed in the current direction changing section of the bus bar.

In the above embodiment, the following modifications and changes or a combination thereof can be made.

(i) The current direction changing section comprises a pair of parallel portions at which the bus bar is orthogonally deformed, and a connection portion at which the pair of parallel portions are connected, and the magnetic detector is disposed between the pair of parallel portions.

(ii) The magnetic detector comprises a magnetic detection element disposed on a substrate, and a yoke surrounding the substrate and allowing the magnetic detection element to be placed between both ends thereof.

(iii) The yoke comprises a pair of bias magnets at both ends thereof.

(iv) The magnetic detection element comprises a GMR (giant magnetoresistive effect) element.

(v) The magnetic detection element comprises a hall element.

(vi) The magnetic detector comprises an output terminal on the substrate.

(vii) The magnetic detector includes a plurality of magnetic detectors which each comprise the substrate, the magnetic detection element and the yoke, and the plurality of magnetic detectors are arranged corresponding to a plurality of the bus bars, and disposed on a common insulating substrate.

(viii) The bus bar comprises three bus bars for three-phase alternating current which each comprise a same shape and are disposed in parallel.

(ix) The magnetic detector is attached to any one of the three bus bars.

(x) The magnetic detector is attached to centered one of the three bus bars.

(xi) The magnetic detector is shielded by a shield member fitted outwardly to the pair of parallel portions of the bus bar.

(xii) The shield member comprises a magnetic material that comprises a thickness of about 1 to 3 mm and an excellent magnetic shielding property, and a rectangular cylindrical shape.

According to another embodiment of the present invention, an electric current detector comprises:

a conductor comprising a first portion and a second portion, wherein a first magnetic flux is generated by electric current flowing through the first portion and a second magnetic flux is generated by electric current flowing through the second portion; and a magnetic detector disposed in a region that the first magnetic flux and the second magnetic flux pass through to be accumulative in magnetic flux density.

In the above embodiment, the following modifications and changes or a combination thereof can be made.

(xiii) The conductor comprises a bus bar comprising a current direction changing section formed to have at least the first portion and the second portion.

BRIEF DESCRIPTION OF THE DRAWINGS

The present invention will be explained in more detail in conjunction with appended drawings, wherein.

DESCRIPTION OF THE PREFERRED EMBODIMENTS

Preferred embodiments of the present invention will be described hereinafter by referring to the accompanying drawings.

Figure 1:
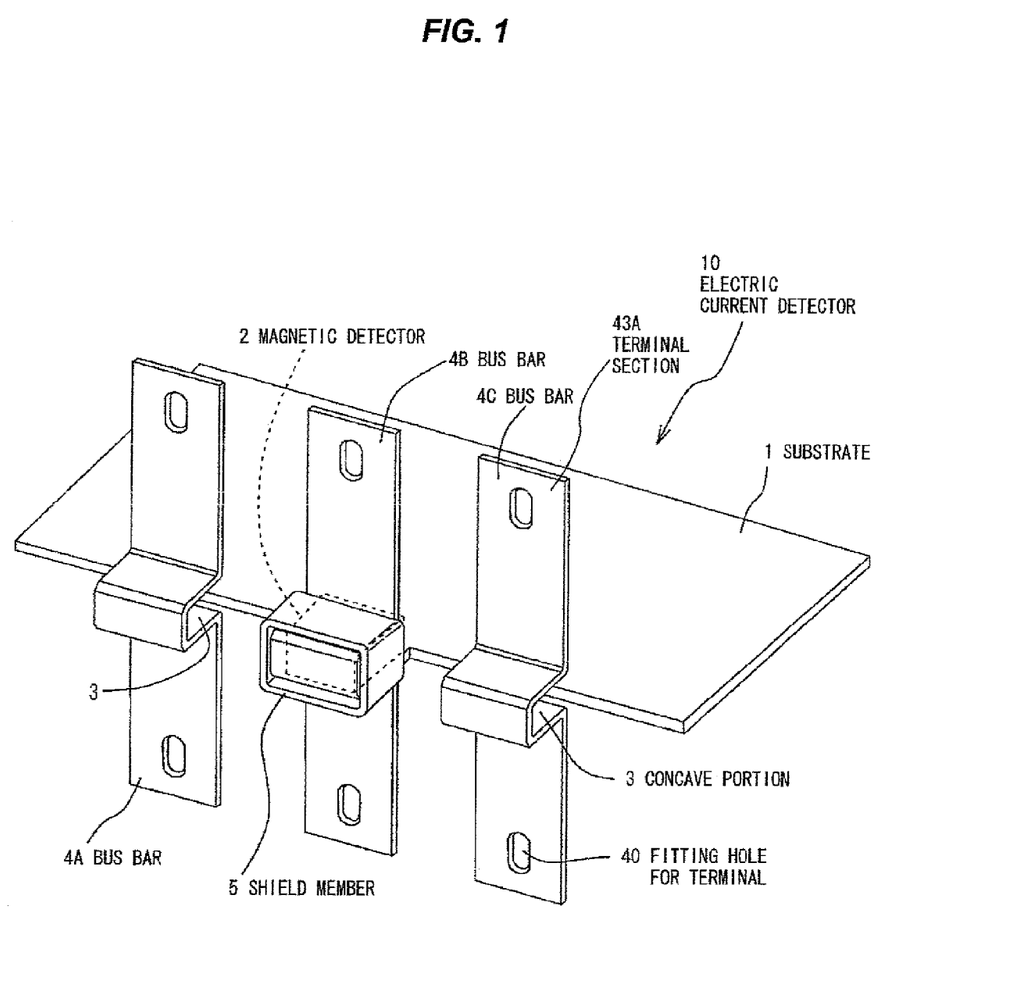
FIG. 1 is a perspective view showing the electric current detector according to an embodiment of the present invention.
Figure 2:
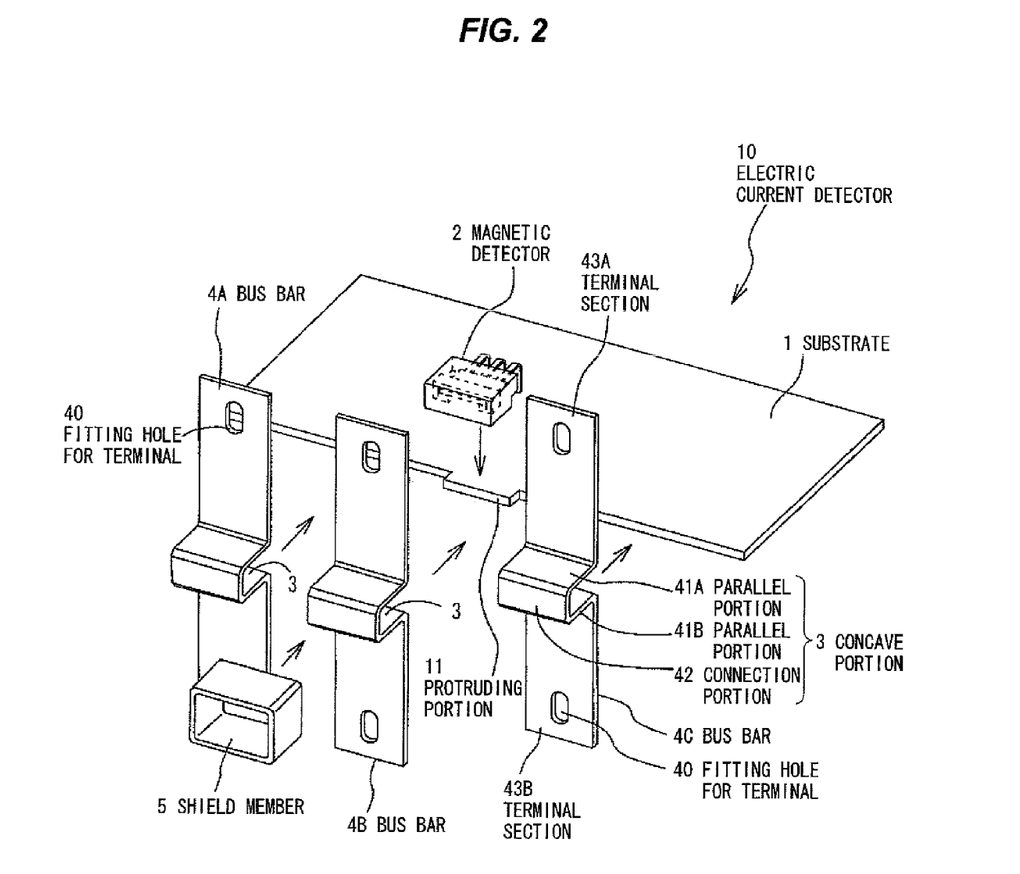
FIG. 2 is an exploded perspective view showing the electric current detector of FIG. 1.

FIG. 1 is a perspective view showing the electric current detector according to an embodiment of the present invention; and FIG. 2 is an exploded perspective view showing the electric current detector of FIG. 1 wherein the electric current detector 10 is composed of a substrate 1 on which a wiring pattern is formed, a magnetic detector 2 disposed on the substrate 1 at a predetermined position, bus bars 4A to 4C each having a concave portion 3 into which the magnetic detector 2 can be fitted and a fitting hole for terminal 40 used for screwing the terminal of a power cable and the like, and a shield member 5 fitted so as to surround the outer circumferences of the magnetic detector 2 and the concave portion 3. It is to be noted that members and the like for holding the substrate 1 and the bus bars 4A to 4C are required further in reality, but only the major parts are shown in FIGS. 1 and 2.

The substrate 1 is fabricated by the use of a material of, for example, glass fiber reinforced epoxy resin or the like in the profile wherein a protruding portion 11 is formed on a side of the substrate, whereby the magnetic detector 2 is disposed on the protruding portion 11. Although it is not shown in FIG. 2, the protruding portion 11 is provided with a throughhole for inserting a lead terminal of the magnetic detector 2.

The magnetic detector 2 is constructed by using, for example, GMR (giant magnetoresistive effect) element, MR (magnetoresistive effect) element, hall element, hall IC or the like as a magnetic detection element. Among others, GMR element exhibits the highest detection sensitivity, so that the highly sensitive magnetic detector 2 may be constructed. When GMR element or MR element is used for the magnetic detector 2, the construction thereof is the one provided with a bias magnet. In case of applying hall element, no bias magnet is required. In the present embodiment, although the magnetic detector 2 is disposed on only the bus bar 4B, it may be disposed also on the bus bars 4A and 4C.

The bus bars 4A to 4C have the same shapes as that of the others which are fabricated in such a manner that, for example, a metallic material made of copper or a copper alloy is formed into a belt-like member, and a section for changing the direction of an electric current, i.e. the concave portion 3 having a U-shaped profile including a pair of parallel portions obtained by deforming the bus bar at right angle at a position and a connection portion for connecting the pair of parallel portions with each other is provided at the intermediate portion of the belt-like member by means of bending operations.

It is to be noted that the reason for making the bus bars 4A to 4C to have the same shapes as that of the others resides in that electrical balance of three-phase alternating current and mass productivity are taking into consideration. However, the electric current detector according to the present embodiment may be constituted, even if the bus bars 4A to 4C have not the same shapes as that of the others.

In other words, the concave portion 3 is composed of the parallel portions 41A and 41B opposing to the top and bottom faces of the magnetic detector 2, and the connection portion 42 for connecting the parallel portions 41A and 41B. Flat plate-like terminal sections 43A and 43B are extended in the upward and downward directions in FIG. 2 from the parallel portions 41A and 41B, respectively, to constitute the bus bars 4A to 4C. Each of the bus bars 4A to 4C has a thickness and a width by which an electric current of, for example, the maximum 400 A may be permitted to flow.

The shield member 5 has a rectangular cylindrical shape and which is constituted by the use of a magnetic material excellent in magnetic shielding property having a thickness of, for example, around 1 to 3 mm.

(Construction of Magnetic Detector)

Figure 3:
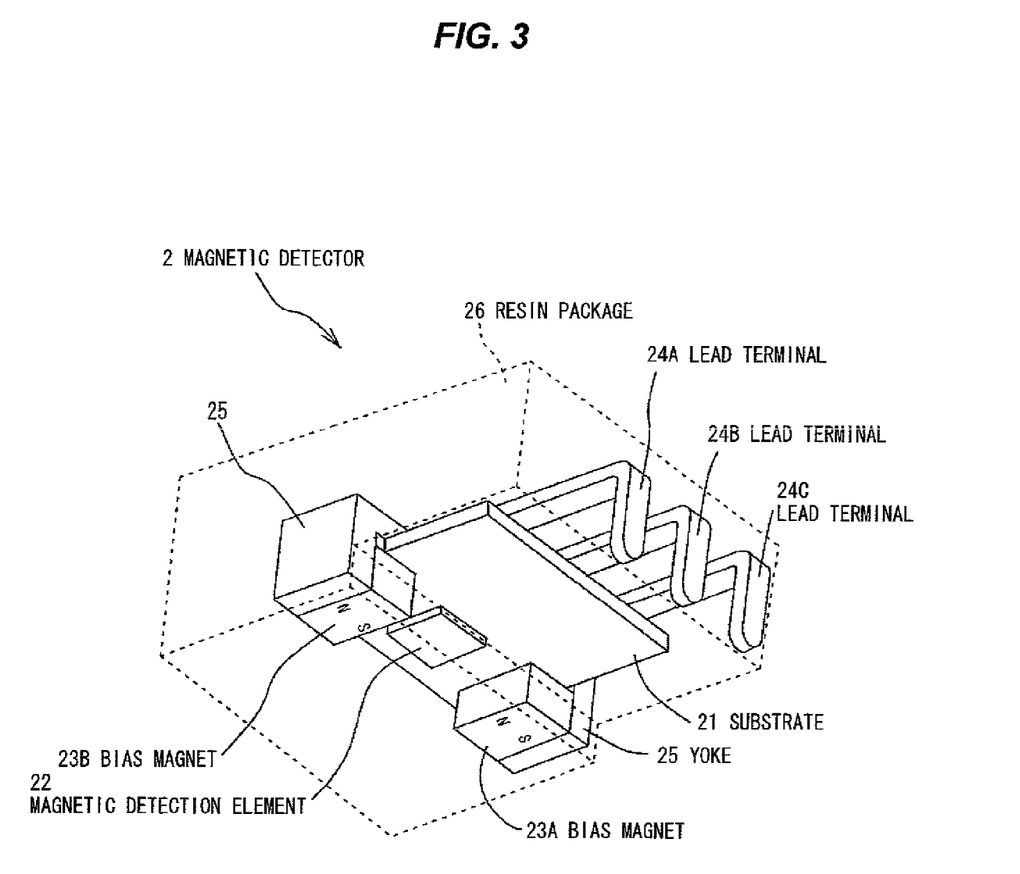
FIG. 3 is a perspective view showing the construction of a magnetic detector.

FIG. 3 is a perspective view showing the construction of a magnetic detector which is the magnetic detector 2 constructed by using a GMR element of a linear output type for a magnetic detection element 22. The magnetic detector 2 is composed of a substrate 21, the magnetic detection element 22 disposed on either surface of the substrate 21 at a predetermined position, a pair of N- and S-polar bias magnets 23A and 23B disposed on the substrate 21 in the opposite sides of the magnetic detection element 22 adjacent thereto, lead terminals 24A to 24C disposed on the other side of the substrate 21 and connected to the electrodes (not shown) of the magnetic detection element 22 through a wiring pattern, yokes 25 made of a magnetic metal material and attached to the opposite sides of the substrate 21, respectively, in a situation wherein the magnets 23A and 23B are held by either of the yokes, and a resin package 26 for sealing the part other than the extreme ends of the lead terminals 24A to 24C.

The magnetic detection element 22 is constructed by laminating, for example, an antiferromagnetic layer, a ferromagnetic layer (pinning layer), a nonmagnetic layer, and a ferromagnetic layer (free layer). The free layer is a layer wherein the orientation of magnetization varies dependent on external magnetic field. The pinning layer has such characteristics that the electric resistance becomes high in the case where the orientation of magnetization is in parallel to the free layer, while the electric resistance becomes low in the reverse case to the above-described case. From the changes of the electric resistance, the magnitude and the orientation of magnetic field due to a bus bar can be detected.

The yoke 25 is constructed by working a belt-like material made of, for example, iron or a metal containing iron into a U-shaped member; and the yoke functions to bear a part of a magnetic circuit for giving the bias magnetic flux B due to the bias magnets 23A and 23B to the magnetic detection element 22.

(Characteristics of Magnetic Detection Element)

Figure 4:
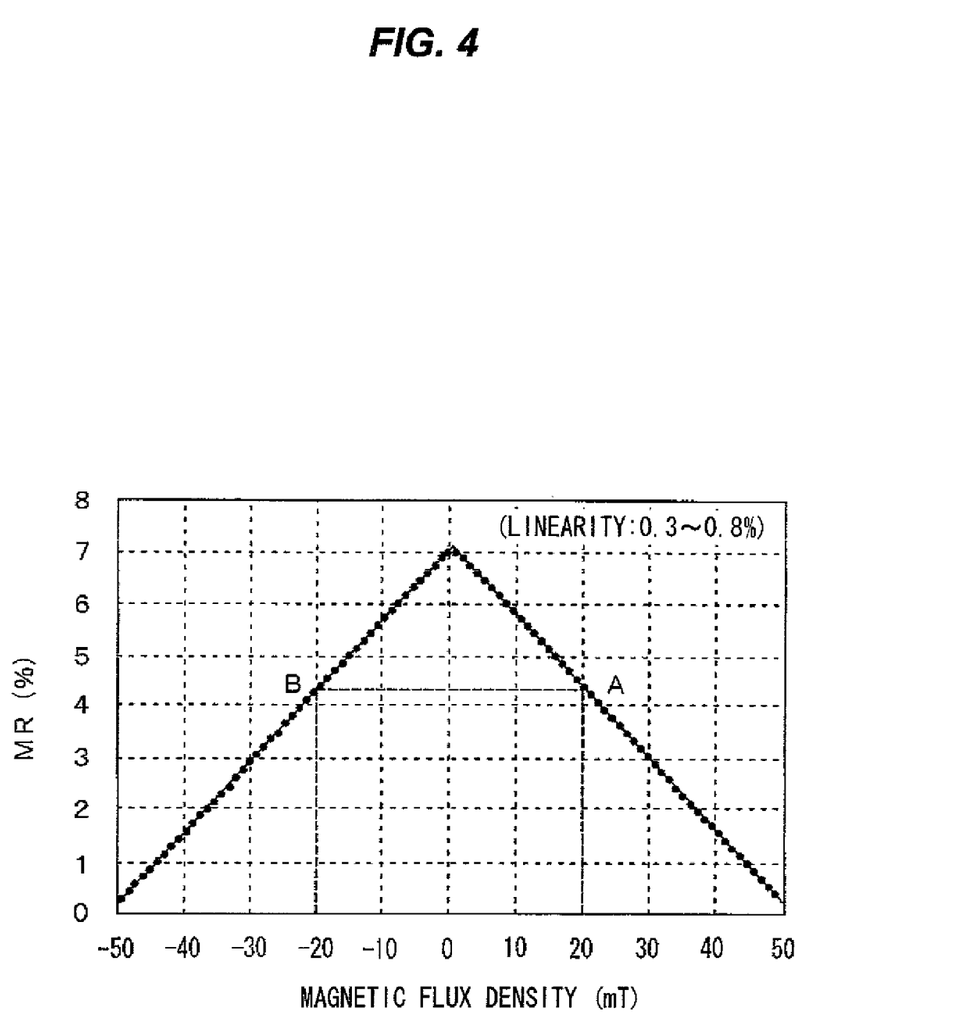
FIG. 4 is a characteristic graphical representation showing the characteristics of a GMR element.

FIG. 4 is a characteristic graphical representation showing the characteristics of a GMR element wherein a resistance percentage change MR (%) appears at right and left positions centering on zero (0) point of magnetic flux density B (mT), i.e. plus (+) and minus (−) sides with respect to the magnetic field applied in parallel to a film formation surface in the GMR element (magnetic detection element 22) as shown in FIG. 4.

The characteristics shown in FIG. 4 exhibit the fact to the effect that when the direction of an electric current changes, the magnetic field comes to be in reverse direction. In this respect, however, it is not clear that the direction of the electric currents at the A and B points in FIG. 4 is either plus (+) or minus (−), even when the magnetic field becomes in reverse direction. Thus, in the present embodiment, the bias magnets 23A and 23B are placed on the opposite sides of the magnetic detector 2 through the yokes 25; and magnetic bias is applied in one direction (the direction in parallel to the magnetic field due to the bus bar 4B) as shown in FIGS. 5A, 5B, and 5C.

(Magnetic Bias Due to Bias Magnets)

Figure 5A:
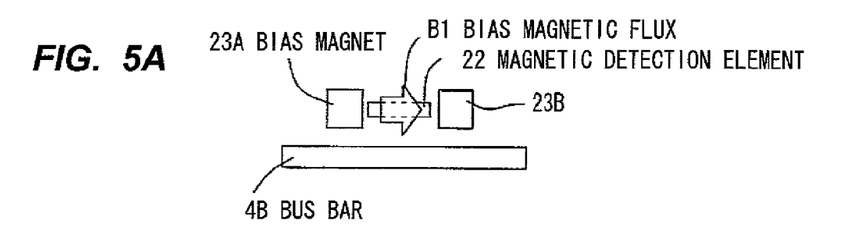
FIGS. 5A to 5D are explanatory diagrams each showing the formation of the magnetic bias due to a bias magnet.
Figure 5B:
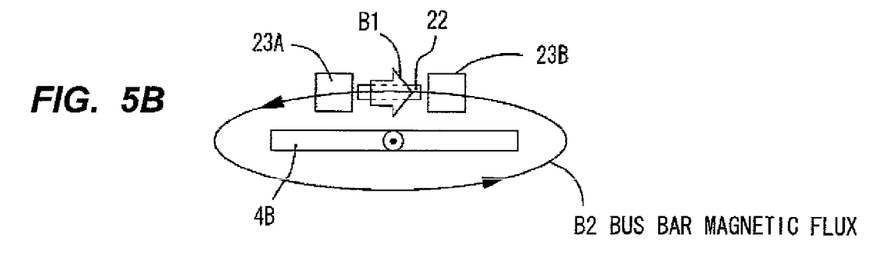
Figure 5C:
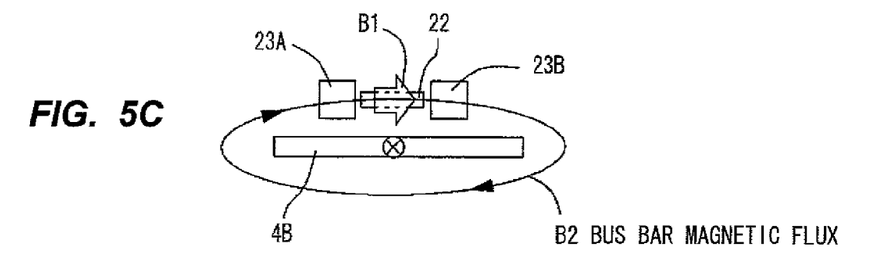
Figure 5D:
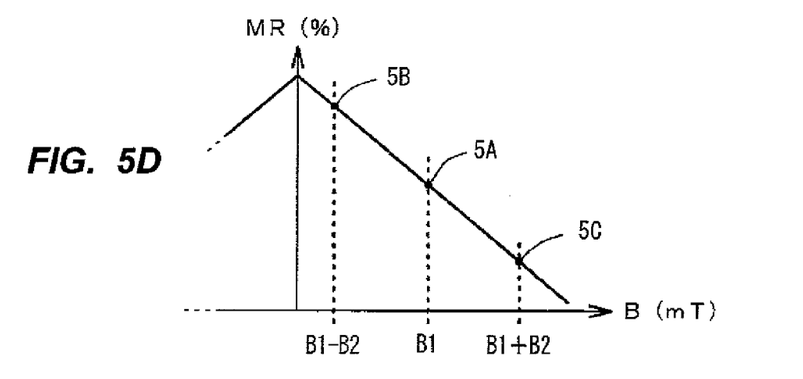

FIGS. 5A, 5B, 5C, and 5D are explanatory diagrams each showing the formation of the magnetic bias due to the bias magnets wherein a flat plate-like bus bar is used; and the results thereof are shown schematically. In FIG. 5D, the characters A, B, and C indicate operating points corresponding to the conditions of FIGS. 5A, 5B and 5C, respectively.

As shown in FIG. 5A, when electric current does not flow into the bus bar 4B, the bias magnetic flux of the value B1 shown in FIG. 5D, i.e. a magnetic flux having the intermediate magnitude of slope characteristics is given to the magnetic detection element 22 from the bias magnet 23A to the bias magnet 23B, whereby the position of magnetic flux density 0 (mT) shown in FIG. 4 is allowed to offset to the position of B1 shown in FIG. 5D.

In the condition shown in FIG. 5A, when an electric current flows into the bus bar 4B along the direction of the front side of FIG. 5B, the magnetic flux density due to the bus bar 4B is −B2 with respect to B1, and the resistance percentage change MR (%) in response to the magnetic flux density of (B1−B2) is detected.

On one hand, when an electric current flows into the bus bar 4B along the direction of the rear side of FIG. 5C in the condition shown in FIG. 5A, the magnetic flux density due to the bus bar 4B is +B2 as shown in FIG. 5C so that the magnetic flux density is formed in the reverse direction to that of the case of FIG. 5B, whereby the resistance percentage change MR (%) in response to the magnetic flux density of (B1+B2) is detected.

As mentioned above, when the optimum bias magnetic field is applied to the magnetic detection element 22 by means of the bias magnets 23A and 23B, a detecting operation can be made in the right side part of the characteristics shown in FIG. 4 (the characteristics shown in FIG. 5D), whereby the detection of the direction of electric current becomes possible.

(Assembling of Electric Current Detector)

First, the magnetic detector 2 constructed as shown in FIG. 3 is prepared, the magnetic detector 2 is disposed on the protruding portion 11 of the substrate 1 at a predetermined position as shown in FIG. 2, and the lead terminals 24A to 24C are soldered onto the wiring pattern on the substrate 1. Then, the protruding portion 11 and the magnetic detector 2 are fitted into the concave portion 3 of the bus bar 4B as shown in FIG. 1. Furthermore, the shield member 5 is fitted outwardly onto the portion where the concave portion 3 of the bus bar 4B is formed.

Next, the magnetic detector 2 and the bus bar 4B as well as the substrate 1 and the bus bars 4A and 4C assembled as mentioned above are subjected to resin-molding (not shown) while keeping the predetermined positioning of these components, whereby the assembly of the electric current detector 10 shown in FIG. 1 is completed.

(Operation of Electric Current Detector)

Next, the operation of the electric current detector will be described. The electric current detector 10 is mounted on, for example, the inverter unit of a hybrid motor car wherein the electric current to be supplied to a three-phase motor flows into the bus bars 4A to 4C. In this case, although each electric current flows into each of the bus bars 4A to 4C, it is assumed in such that the detection of electric current is conducted only in the bus bar 4B. An amplifier (not shown) or the like is connected to the magnetic detector 2 to carry out the measurement of electric current, and the results obtained are either indicated on an indicator and the like (not shown), or used in a control device (not shown).

When an electric current flows into the bus bar 4B, a magnetic field is generated in response to the magnitude and the direction of the passing electric current as explained in FIGS. 5B and 5C. When an electric current flows into the bus bar 4B in the direction shown in FIG. 5B, the detection value shifting to the left side over the position B1 in FIG. 5D is obtained. On the other hand, when an electric current flows into the bus bar 4B in the direction shown in FIG. 5C, the detection value shifting to the right side over the position B1 in FIG. 5D is obtained.

Although no core for capturing the magnetic flux from the bus bar 4B upon energization exists according to the present embodiment, the embodiment increases the magnetic flux generated in spite of the coreless structure. The operation thereof will be described.

(Generation of Magnetic Flux in Concave Portion Upon Energization)

Figure 6A:
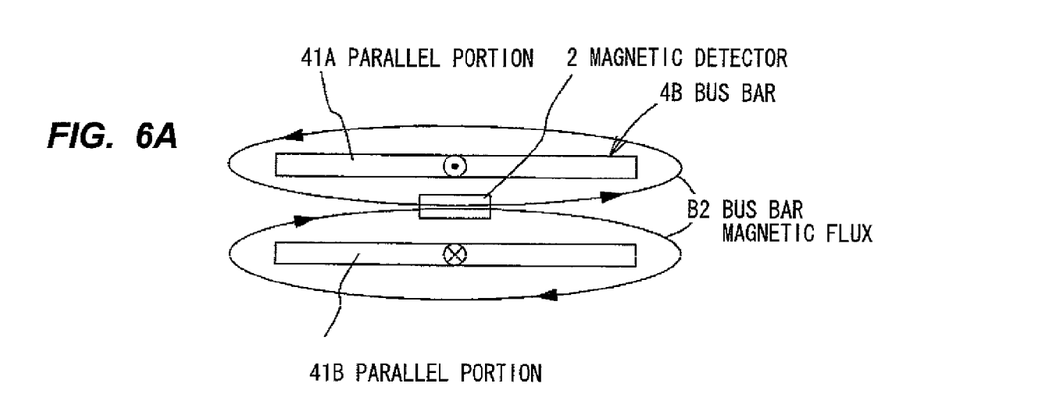
FIGS. 6A and 6B are diagrams each showing the situation of generating the magnetic flux in the concave portion of a bus bar upon energization.
Figure 6B:
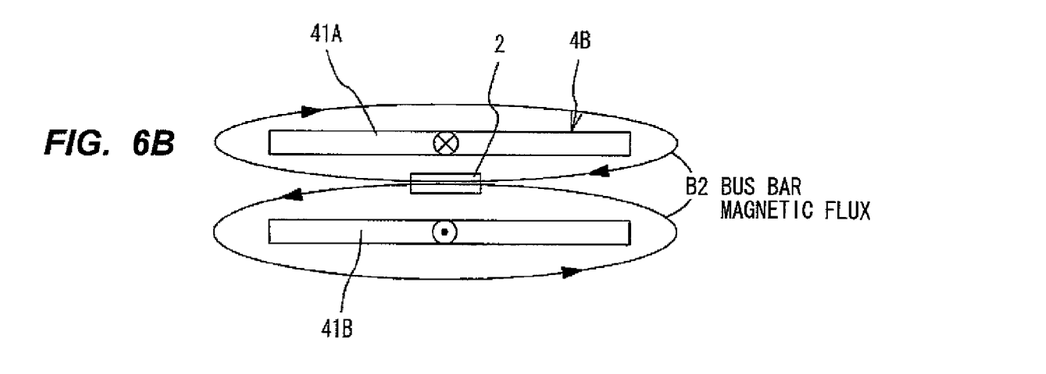

FIGS. 6A and 6B are diagrams each showing the situation of generating the magnetic flux in the concave portion of a bus bar upon energization wherein only the top and bottom parallel portions 41A and 41B of the bus bar 4B are shown, while the connection portion 42, and the terminal sections 43A and 43B are not shown and omitted.

As shown in FIG. 6A, the magnetic detector 2 is disposed between the parallel portions 41A and 41B of the bus bar 4B so as to position the top and bottom surfaces of the magnetic detector in between the parallel portions 41A and 41B. Under the circumstances, both magnetic fields due to the electric currents flowing into the respective parallel portions 41A and 41B of the bus bar 4B pass through the inside of the magnetic detector 2. The upper and lower two magnetic fields similarly pass through the inside of the magnetic detector 2 as shown in FIG. 6B, even when the direction of electric current changes.

Accordingly, since two times much magnetic flux is given from the bus bar 4B in the electric detector 10 according to the present embodiment in comparison with a conventional electric current detector wherein a flat plate bus bar is used, the detection of electric current becomes possible, even if a coreless structure is adopted. Moreover, the number of parts is substantially the same as that of an electric current detector wherein a hall element is used, so that it does not result in increase of costs and expenses.

When an electric current flows into each of the bus bars 4A to 4C, a magnetic field is generated in each of the bus bars 4A and 4C due to the electric currents flowing through the bus bars 4A and 4C. In this respect, since the bus bars 4A to 4C are disposed closely to each other, the adjacent bus bar 4B and the magnetic detector 2 are affected by a part of the magnetic field. However, since the shield member 5 is fitted outwardly to the concave portion 3 of the bus bar 4B, the influence upon the magnetic detector 2 can be reduced.

ADVANTAGEOUS EFFECTS OF THE EMBODIMENT

According to the present embodiment, the following advantageous effects can be attained.

(1) Since the magnetic detection element 22 is disposed between the parallel portions 41A and 41B of the concave portion 3 formed in the bus bar 4B, a magnetic flux is given to the magnetic detection element 22 from the parallel portions 41A and 41B, respectively, upon energization, so that sufficient detection sensitivity can be obtained even in a coreless structure. Thus, downsizing due to the coreless structure becomes possible.

(2) Since the magnetic detection element 22 is shielded by the shield member 5 and the concave portion 3 of the bus bar 4B from external magnetic field, the influence of magnetic fluxes from the adjacent bus bars 4A and 4C can be reduced, whereby detection accuracy can be improved.

In the following, examples of the present invention will be described.

Example 1

Figure 7:
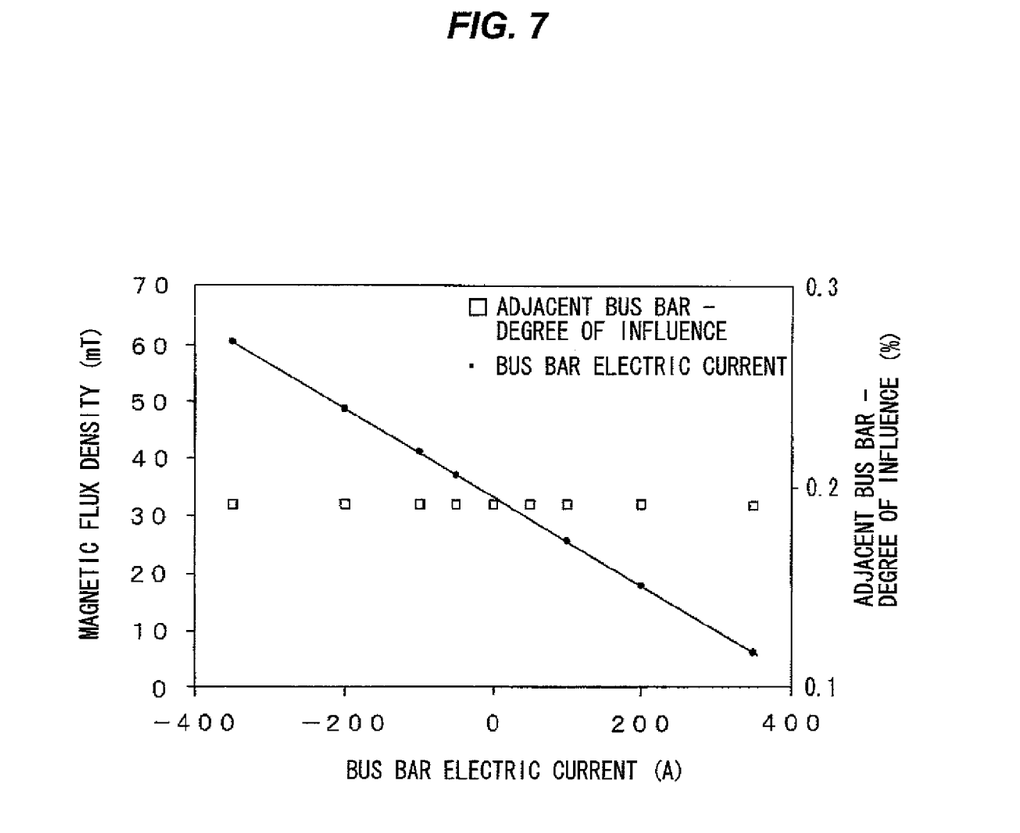
FIG. 7 is a characteristic graphical representation according to Example 1 wherein a relationship between the electric current of a bus bar and the magnetic flux given to a magnetic detector is shown.

FIG. 7 is a characteristic graphical representation wherein a relationship between the electric current of a bus bar and the magnetic flux given to a magnetic detector is shown. The magnetic flux density in the case when an electric current of 0 to 350 A is applied to the bus bar 4B in the magnetic detector 2 having the construction shown in FIGS. 1 and 2 is measured (the ordinate on the left side of FIG. 7).

As a result, magnetic flux density in response to the direction of electric current can be measured in a linear characteristic region on the border of about 30 (mT) as shown in FIG. 7. Namely, the direction of electric current can be detected.

On one hand, a degree of influence (%) due to the bus bars 4A and 4C adjacent to the bus bar 4B is also measured. The measurement is conducted in such that an electric current of from 0 to 350 A is applied step-by-step to the bus bar 4B, while an electric current of 350 A (fixed) is applied to the bus bars 4A and 4C, respectively.

As a consequence, it has been found that a degree of influence (the ordinate on the right side of FIG. 7) is within a range of 0.2%, in other words, a condition of substantially no influence can be maintained as shown in FIG. 7. This result is derived from the provision of the shield member 5. For comparison, a degree of influence is measured in the construction shown in FIGS. 1 and 2 without providing the shield member 5. As a result, it has been confirmed that the magnetic detector 2 is affected by the influence of 2.7 to 3% due to the magnetic flux from the bus bars 4A and 4C. Furthermore, a degree of influence from the adjacent bus bar is measured in a conventional electric current detector provided with a core under the same condition as that of Example 1. As a result, the degree of influence of around 0.8% was measured. From the above-mentioned results, it has been found that the present embodiment has a structure which is extremely hardly affected by the adjacent bus bar.

Example 2

Figure 8:
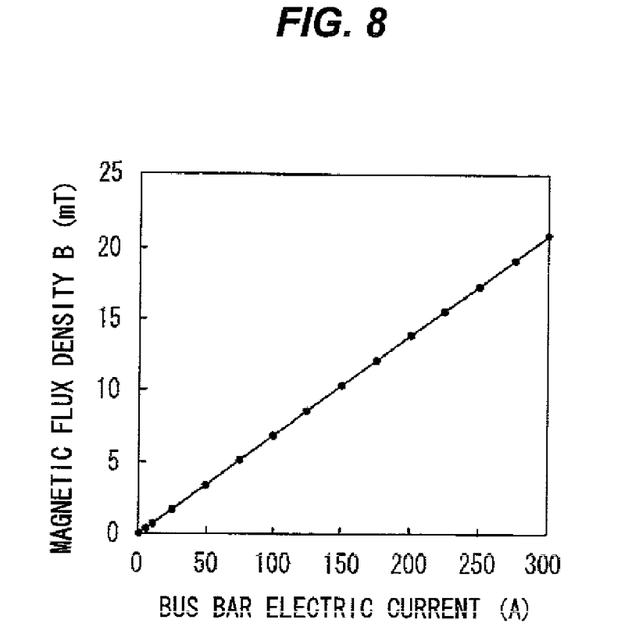
FIG. 8 is a characteristic graphical representation showing a relationship between the electric current and the magnetic flux of the magnetic detector wherein a shield member is provided (Example 2)
Figure 9:
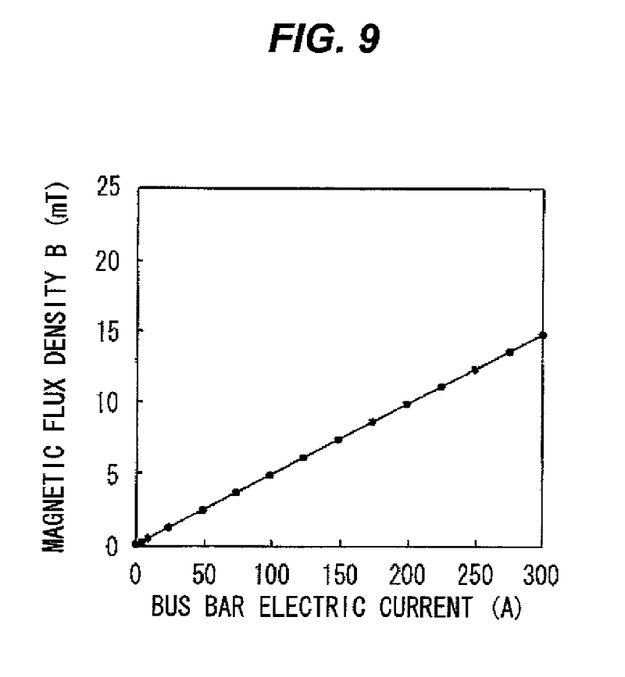
FIG. 9 is a characteristic graphical representation showing a relationship between the electric current and the magnetic flux of the magnetic detector wherein a shield member is not provided (Comparative Example)

FIG. 8 is a characteristic graphical representation showing a relationship between the electric current and the magnetic flux of the magnetic detector 2 wherein the shield member 5 is provided; and FIG. 9 is Comparative Example of a characteristic graphical representation showing a relationship between the electric current and the magnetic flux of the magnetic detector 2 wherein the shield member 5 is not provided.

In Example 2 shown in FIG. 8, a magnetic flux density in the case where the electric current flowing through the bus bar 4B is 300 A is 22 mT, while in Comparative Example of FIG. 9, a magnetic flux density in the case where the electric current flowing through the bus bar 4B is 300 A is 14.5 mT. Accordingly, the magnetic flux density in Example 2 is about 1.52 times higher than that of Comparative Example. This means that the magnetic flux density increases, in other words, sensitivity increases as a result of providing the shield member 5. In addition, it becomes possible to decrease the influence in the magnetic detector 2 affected by the external magnetic field as a result of increasing the magnetic flux density.

Example 3

Figure 10A:
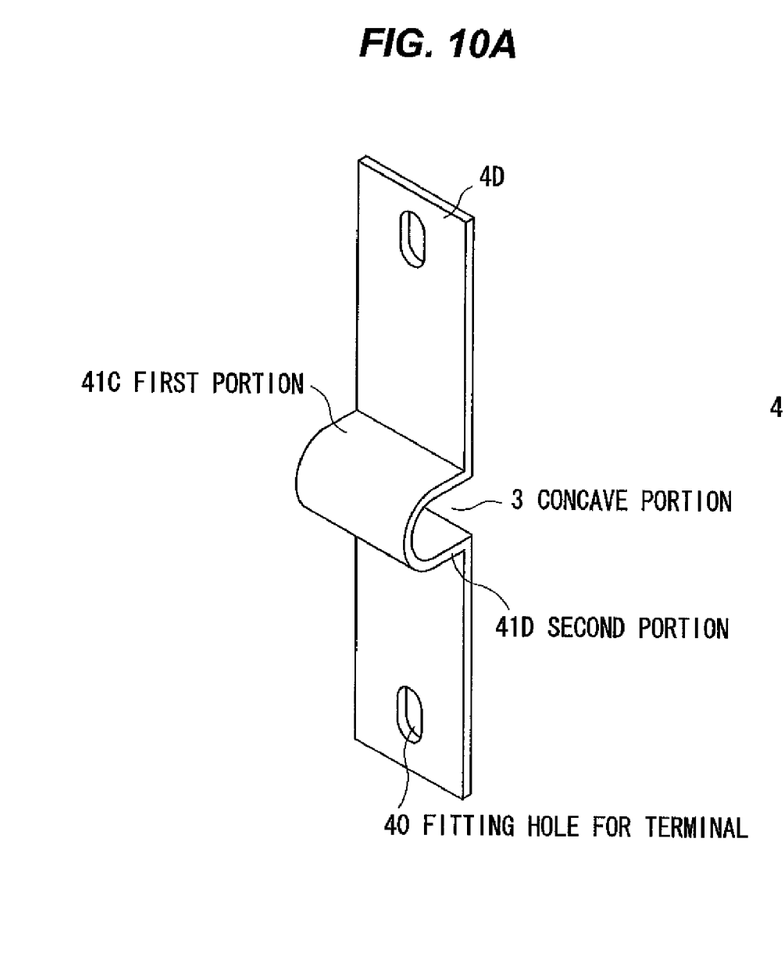
FIGS. 10A and 10B are perspective views each showing another shape of the bus bar as an electric conductor.
Figure 10B:
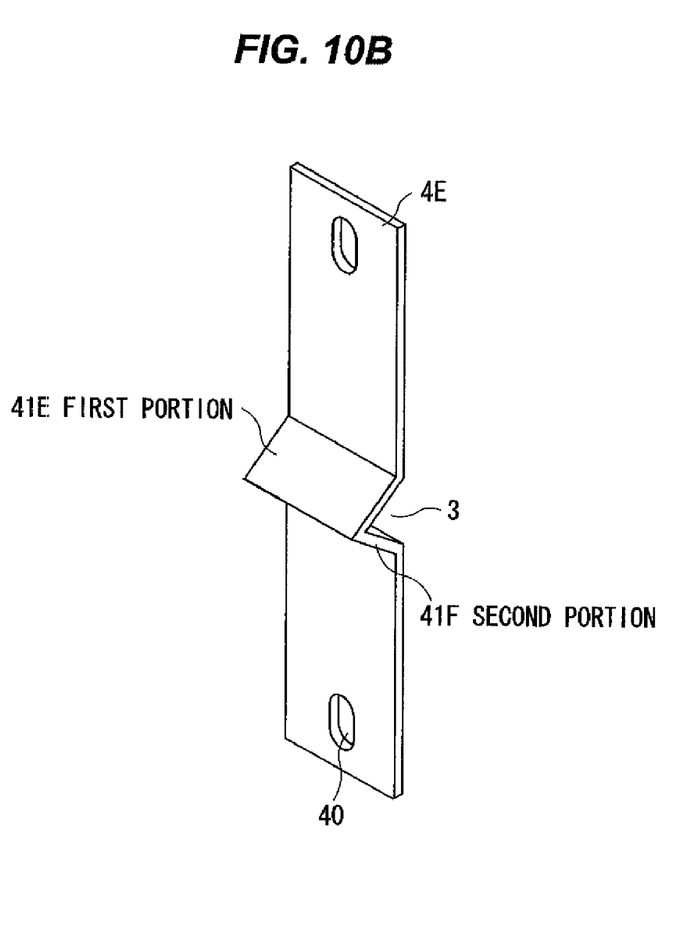

FIGS. 10A and 10B are perspective views each showing another shape of the bus bar as an electric conductor wherein a bus bar 4D has a first portion 41C and a second portion 41D being different circular arc profile from one another surrounding the concave portion 3 of the bus bar 4D. The first magnetic flux generated due to the electric current flowing through the first portion 41C is added to the second magnetic flux generated due to the electric current flowing through the second portion 41D in the region of the concave portion 3. Furthermore, the bus bar 4E having the shape shown in FIG. 10B is the same as that of the bus bar 4D mentioned above wherein the bus bar 4E has a first portion 41E and a second portion 41F being flat different portions from one another surrounding the concave portion 3 of the bus bar 4E. The first magnetic flux generated due to the electric current flowing through the first portion 41E is added to the second magnetic flux generated due to the electric current flowing through the second portion 41F in the region of the concave portion 3.

In other bus bars than that described above, the magnetic fluxes generated are added to each other in the region of the concave portion 3 so far as the bus bar is the electric conductor having the shape containing at least a first portion and a second portion being different from one another in the direction of a flowing electric current, so that the detection sensitivity of the magnetic detector 2 disposed in the concave portion 3 is improved. The other construction and the like of the bus bars are the same as that shown in FIGS. 1, 2, and 3.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An electric current detector, comprising:
    a bus bar comprising a current direction changing section for changing a direction of electric current through the bus bar,
    wherein the current direction changing section comprises a pair of parallel portions at which the bus bar is orthogonally deformed, and a connection portion at which the pair of parallel portions are connected; and
    a magnetic detector disposed in the current direction changing section of the bus bar between the pair of parallel portions,
    wherein the magnetic detector comprises a magnetic detection element disposed on a substrate, and a yoke surrounding the substrate and allowing the magnetic detection element to be placed between both ends thereof.

2. The electric current detector according to claim 1, wherein:
    the yoke comprises a pair of bias magnets at both ends thereof.

3. The electric current detector according to claim 2, wherein:
    the magnetic detection element comprises a GMR (giant magnetoresistive effect) element.

4. The electric current detector according to claim 1, wherein:
    the magnetic detection element comprises a hall element.

5. The electric current detector according to claim 1, wherein:

the magnetic detector comprises an output terminal on the substrate.

6. The electric current detector according to claim 1, wherein:

the magnetic detector includes a plurality of magnetic detectors which each comprise the substrate, the magnetic detection element and the yoke, and the plurality of magnetic detectors are arranged corresponding to a plurality of the bus bars, and disposed on a common insulating substrate.

7. The electric current detector according to claim 1, wherein the magnetic detector is shielded by a shield member fitted outwardly to a concave portion having a U-shaped profile including the pair of parallel portions of the bus bar.

8. The electric current detector according to claim 7, wherein:

the shield member comprises a magnetic material that comprises a thickness of about 1 to 3 mm and an excellent magnetic shielding property, and a rectangular cylindrical shape.

\* \* \* \* \*